United States Patent
Gilan et al.

(10) Patent No.: US 11,622,451 B2
(45) Date of Patent: Apr. 4, 2023

(54) SYSTEMS AND METHODS FOR SOLDER PASTE PRINTING ON COMPONENTS

(71) Applicant: IO Tech Group Ltd., London (GB)

(72) Inventors: Ziv Gilan, Kfar-harif (IL); Michael Zenou, Hashmonaim (IL)

(73) Assignee: IO Tech Group Ltd., Modiin (IL)

( * ) Notice: Subject to any disclaimer, the term of this patent is extended or adjusted under 35 U.S.C. 154(b) by 0 days.

(21) Appl. No.: 17/247,981

(22) Filed: Jan. 4, 2021

(65) Prior Publication Data
US 2021/0267067 A1    Aug. 26, 2021

Related U.S. Application Data

(60) Provisional application No. 62/981,900, filed on Feb. 26, 2020.

(51) Int. Cl.
*H05K 3/34* (2006.01)
*H05K 3/12* (2006.01)

(52) U.S. Cl.
CPC ......... *H05K 3/1216* (2013.01); *H05K 3/3457* (2013.01)

(58) Field of Classification Search
CPC ............... H05K 3/1216; H05K 3/3457; H05K 13/0469; B23K 3/082
See application file for complete search history.

(56) References Cited

U.S. PATENT DOCUMENTS

| | | |
|---|---|---|
| 5,155,324 A | 10/1992 | Deckard et al. |
| 5,204,055 A | 4/1993 | Sachs et al. |
| 5,236,637 A | 8/1993 | Hull |
| 5,436,083 A | 7/1995 | Haluska et al. |
| 5,506,607 A | 4/1996 | Sanders, Jr. et al. |
| 5,740,051 A | 4/1998 | Sanders, Jr. et al. |
| 5,837,960 A | 11/1998 | Lewis et al. |

(Continued)

FOREIGN PATENT DOCUMENTS

| | | |
|---|---|---|
| CN | 103597589 A | 2/2014 |
| DE | 102011083627 A1 | 3/2013 |

(Continued)

OTHER PUBLICATIONS

Written Opinion of the International Preliminary Examining Authority dated Jan. 5, 2022, from the IPEA/European Patent Office, for International Patent Application No. PCT/IB2021/050026 (filed May 1, 2021), 8 pgs.

(Continued)

*Primary Examiner* — Christopher E Mahoney
*Assistant Examiner* — Marissa Ferguson-Samreth
(74) *Attorney, Agent, or Firm* — Ascenda Law Group, PC

(57) ABSTRACT

Systems and methods in which dot-like portions of a material (e.g., a viscous material such as a solder paste) are printed or otherwise transferred onto an electronic component at a first printing unit, and the electronic component is subsequently placed onto a substrate with the portions of viscous material between the electronic component and the substrate. Optionally, a printing unit which prints the dots of material onto the electronic component includes a coating system that creates a uniform layer of the material on a donor substrate, and the material is transferred in the individual dot-like portions from the donor substrate onto the electronic component by the printing unit. The system may also include imaging units to aid in the overall process.

17 Claims, 4 Drawing Sheets

(56) References Cited

U.S. PATENT DOCUMENTS

| | | |
|---|---|---|
| 6,122,036 A | 9/2000 | Yamasaki et al. |
| 6,537,359 B1 | 3/2003 | Spa |
| 7,198,736 B2 | 4/2007 | Kasuga et al. |
| 7,438,846 B2 | 10/2008 | John |
| 7,658,603 B2 | 2/2010 | Medina et al. |
| 7,892,474 B2 | 2/2011 | Snkolnik et al. |
| 8,236,373 B2 | 8/2012 | Fumo et al. |
| 8,252,223 B2 | 8/2012 | Medina et al. |
| 8,740,040 B2 | 6/2014 | Choi et al. |
| 9,636,873 B2 | 5/2017 | Joyce |
| 9,808,822 B2 | 11/2017 | Martensson et al. |
| 9,901,983 B2 | 2/2018 | Hovel et al. |
| 10,144,034 B2 | 12/2018 | Zenou |
| 2004/0101619 A1 | 5/2004 | Camorani |
| 2005/0109734 A1 | 5/2005 | Kuriyama et al. |
| 2005/0212888 A1 | 9/2005 | Lehmann et al. |
| 2007/0164089 A1 | 7/2007 | Gaugler |
| 2007/0201122 A1 | 8/2007 | Dozeman et al. |
| 2008/0166490 A1 | 7/2008 | Hogan et al. |
| 2009/0074987 A1 | 3/2009 | Auyeung et al. |
| 2009/0217517 A1 | 9/2009 | Pique et al. |
| 2009/0274833 A1 | 11/2009 | Li et al. |
| 2011/0017841 A1 | 1/2011 | Holm et al. |
| 2013/0176700 A1 | 7/2013 | Stevens et al. |
| 2013/0224474 A1 | 8/2013 | Theunissen et al. |
| 2015/0033557 A1 | 2/2015 | Kotler et al. |
| 2015/0239236 A1 | 8/2015 | Stefani et al. |
| 2016/0233089 A1 | 8/2016 | Zenou et al. |
| 2017/0120260 A1 | 5/2017 | Oetjen |
| 2017/0189995 A1 | 7/2017 | Zenou et al. |
| 2017/0210142 A1 | 7/2017 | Kotler et al. |
| 2017/0250294 A1 | 8/2017 | Zenou et al. |
| 2017/0306495 A1 | 10/2017 | Kotler et al. |
| 2017/0348908 A1 | 12/2017 | Liu et al. |
| 2018/0015502 A1 | 1/2018 | Zenou |
| 2018/0090314 A1 | 3/2018 | Kotler et al. |
| 2018/0193948 A1 | 7/2018 | Zenou et al. |
| 2018/0281243 A1 | 10/2018 | Zenou et al. |
| 2019/0143449 A1 | 5/2019 | Zenou |
| 2019/0150292 A1 | 5/2019 | Tsukada et al. |
| 2019/0322036 A1 | 10/2019 | Zenou et al. |
| 2020/0350275 A1 | 11/2020 | Zenou et al. |
| 2021/0028141 A1 | 1/2021 | Zenou et al. |
| 2021/0237184 A1 | 8/2021 | Zenou et al. |
| 2021/0385951 A1 | 12/2021 | Zenou |
| 2022/0040912 A1 | 2/2022 | Zenou et al. |

FOREIGN PATENT DOCUMENTS

| | | |
|---|---|---|
| DE | 102017120750 A1 | 3/2019 |
| EP | 1213083 A2 | 6/2002 |
| EP | 3032933 A1 | 6/2016 |
| EP | 3089573 A1 | 11/2016 |
| EP | 3 219 412 A1 | 9/2017 |
| EP | 3468312 A1 | 4/2019 |
| JP | H01 221466 A | 9/1989 |
| WO | 01/72489 A2 | 10/2001 |
| WO | 2007/020644 A1 | 2/2007 |
| WO | 2007/026366 A1 | 3/2007 |
| WO | 2007/084888 A2 | 7/2007 |
| WO | 2014/078537 A1 | 5/2014 |
| WO | 2014/113937 A1 | 7/2014 |
| WO | 2014/126837 A2 | 8/2014 |
| WO | 2015/144967 A2 | 10/2015 |
| WO | 2015/192146 A1 | 12/2015 |
| WO | 2016/020817 A1 | 2/2016 |
| WO | 2016/124708 A1 | 8/2016 |
| WO | 2016/198291 A1 | 12/2016 |
| WO | 2018/003000 A1 | 1/2018 |
| WO | 2018/104432 A1 | 6/2018 |
| WO | 2018/136480 A1 | 7/2018 |
| WO | 2018/216002 A1 | 11/2018 |

OTHER PUBLICATIONS

International Search Report and Written Opinion dated Jun. 24, 2020, from the ISA/European Patent Office, for International Patent Application No. PCT/IB2020/053827 (filed Apr. 22, 2020), 15 pages.

Written Opinion of the International Preliminary Examining Authority dated Mar. 19, 2021, from the IPEA/European Patent Office, for International Patent Application No. PCT/IB2020/053827 (filed Apr. 22, 2020), 6 pgs.

International Search Report and Written Opinion dated Apr. 16, 2021, from the ISA/European Patent Office, for International Patent Application No. PCT/IB2021/050025 (filed Jan. 5, 2021), 13 pgs.

Non-Final Office Action dated Jan. 28, 2022, for U.S. Appl. No. 17/302,449, filed May 3, 2021, 10 pgs.

International Preliminary Report on Patentability dated Jul. 27, 2021, from the IPEA/European Patent Office, for International Patent Application No. PCT/IB2020/053827 (filed Apr. 22, 2020), 37 pgs.

International Preliminary Report on Patentability dated Jan. 14, 2022, from the IPEA/European Patent Office, for International Patent Application No. PCT/IB2021/050025 (filed May 1, 2021), 19 pgs.

International Search Report and Written Opinion dated Apr. 29, 2021, from ISA/European Patent Office, for International Patent Application No. PCT/IB2021/050027 (filed Jan. 5, 2021), 11 pgs.

Non-Final Office Action dated Feb. 15, 2022, for U.S. Appl. No. 16/807,489, filed Mar. 3, 2020, 19 ogs.

Amendment filed Mar. 28, 2022, for U.S. Appl. No. 16/807,489, filed Mar. 3, 2020, 17 pgs.

Amendment filed Apr. 4, 2022, for U.S. Appl. No. 17/302,449, filed May 3, 2021, 10 pgs.

International Search Report and Written Opinion dated Apr. 1, 2021, from the ISA/European Patent Office, for International Patent Application No. PCT/IB2021/050026 (filed Jan. 5, 2021), 13 pgs.

Non-Final Office Action dated May 9, 2022, for U.S. Appl. No. 15/949,281, filed Apr. 22, 2020, 11 pgs.

Notice of Allowance dated Jun. 16, 2022, for U.S. Appl. No. 16/807,489, filed Mar. 3, 2020, 9 pgs.

Final Office Action dated Jun. 9, 2022, for U.S. Appl. No. 17/302,449, filed May 3, 2021, 11 pgs.

Amendment filed Jul. 14, 2022, for U.S. Appl. No. 15/929,281, filed Apr. 22, 2020, 10 pgs.

International Preliminary Report on Patentability dated Jul. 5, 2022, from the IPEA/European Patent Office, for International Patent Application No. PCT/IB021/050027 (filed Jan. 5, 2021), 6 pgs.

International Preliminary Report on Patentability dated Jun. 15, 2022, from the IPEA/European Patent Office, for International Patent Application No. PCT/IB/2021/050026 (filed Jan. 5, 2021), 6 pgs.

Final Office Action dated Aug. 16, 2022, for U.S. Appl. No. 15/949,281, filed Apr. 22, 2020, 14 pgs.

Chinese Patent Publication No. 103597589 A, published Feb. 19, 2014, English translation, 33 pgs.

Amendment filed Jul. 22, 2022, for U.S. Appl. No. 17/302,449, filed May 3, 2021, 7 pgs.

Advisory Action dated Aug. 10, 2022, for U.S. Appl. No. 17/302,449, filed May 3, 2021, 3 pgs.

Notice of Allowance dated Sep. 8, 2022, for U.S. Appl. No. 17/302,449, filed May 3, 2021, 9 pgs.

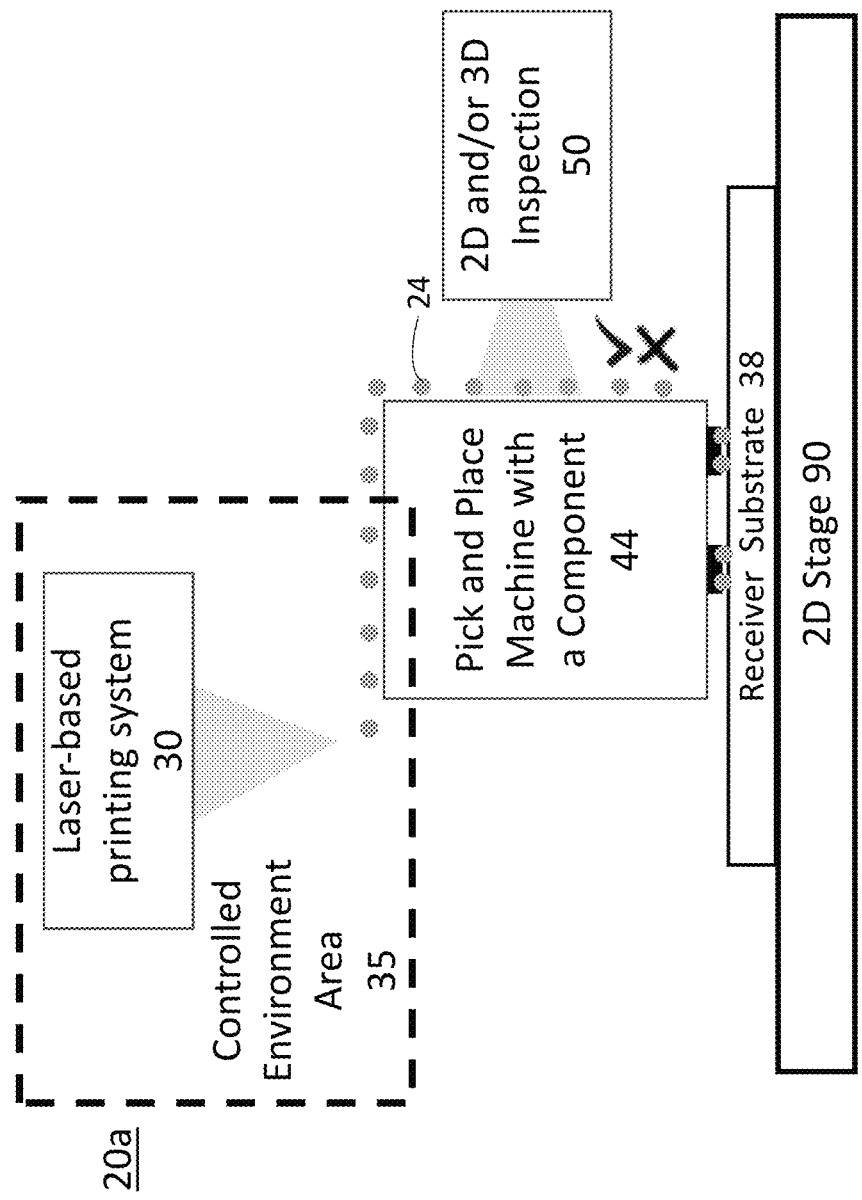

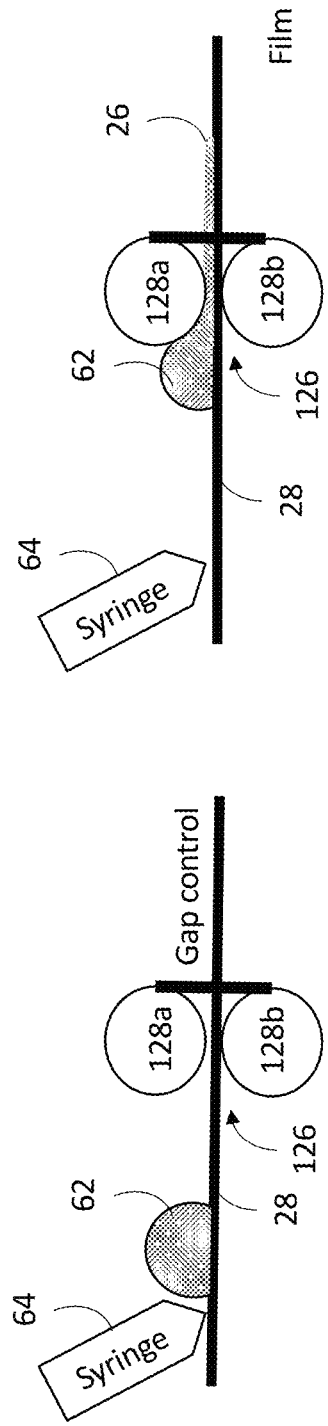
Fig. 4b
Fig. 4a
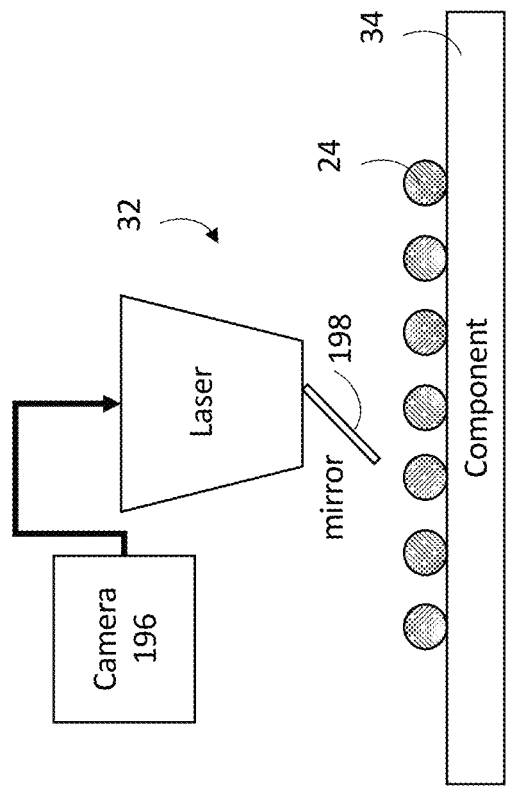
Fig. 5

SYSTEMS AND METHODS FOR SOLDER PASTE PRINTING ON COMPONENTS

RELATED APPLICATIONS

This is a NONPROVISIONAL of, claims priority to, and incorporates by reference U.S. Provisional Application No. 62/981,900, filed 26 Feb. 2020.

FIELD OF THE INVENTION

The present invention relates to systems and methods for printing solder paste on electronic components from a coated film and placing the electronic components onto a substrate with the solder paste therebetween.

BACKGROUND

Surface Mount Technology (SMT) is an area of electronic assembly used to mount electronic components to the surface of a printed circuit board (PCB), as opposed to inserting components through holes in the PCB as in conventional assembly. SMT was developed to reduce manufacturing costs and allow efficient use of PCB space. As a result of the introduction of surface mount technology and ever increasing levels of automation, it is now possible to build highly complex electronic circuits into smaller and smaller assemblies with good repeatability.

The surface mount soldering process involves placing the electrical contact of an electronic component or substrate, a small amount of solder paste, and a solder-wettable pad on a printed circuit board in proximity to one another. The materials are then heated until the solder reflows, forming an electrical connection between the solder-wettable pad and the electrical contact of the electronic component. Once the solder has reflowed, it forms both an electrical and a mechanical connection between the electronic component and the printed circuit board. This process has numerous advantages over other methods of interconnection because components can be interconnected simultaneously and the process is repeatable, low cost, and easy to adapt for mass production.

One of the most important parts of the surface mount assembly process is the application of solder paste to the printed circuit board. The aim of this process is to accurately deposit the correct amount of solder onto each of the pads to be soldered. This is achieved generally by screen-printing the solder paste through a stencil or foil but also may be done by jet printing. It is widely believed that this part of the process, if not controlled correctly, accounts for most of the assembly defects.

Solder paste itself is a mixture of a flux composition and a powdered solder metal alloy that is widely used in the electronics industry. At room temperature the solder paste is compliant enough so that it can be made to conform to virtually any shape. At the same time, it is "tacky" enough that it tends to adhere to any surface it is placed into contact with. These qualities make solder paste useful for both surface mount soldering and for forming solder bumps on electronic components such as ball grid array packages or on a printed circuit board.

The solder paste printing is a very critical stage in current surface mount assembly processes. When a stencil or a film is used for the printing there are several possible items that can negatively impact the procedure resulting in defects in the end product. For example, the stencil itself should be very accurate: a stencil that is too thick will cause a solder bridge short while a stencil that is too thin will cause insufficient solder to be applied. Similarly, when the stencil aperture size is too big, a solder bridge short can occur but when the stencil aperture size is too small insufficient solder paste will be applied. It is generally considered best to use a circular-shaped stencil aperture sized slightly smaller than the PCB pad size, preventing a bridging defect during reflow. Nevertheless, defects can occur in stencil production.

The blade used for the screen printing should also be optimized: the blade angle affects the vertical force applied on the solder paste. If the angle is too small, the solder paste will not be squeezed into the stencil apertures. If the blade pressure is too small, it will prevent the solder paste from being cleanly applied to the stencil and if it is too high, it will result in more paste leakage.

Another crucial point is that the higher the printing speed the less time will be spent in applying the solder paste through the stencil aperture surface and, therefore, a higher printing speed may cause insufficient solder to be applied. In current processes, the printing speed should be controlled to around 20-40 mm/s and, therefore, the maximum speed is currently limited by the printing process.

The use of jet printing for the process is limited since the solder paste is a highly viscous thixotropic material and, therefore, jetting is quite complicated since most jetting heads are designed for low viscosity materials and are highly susceptible to clogging. However, jetting and dispensing is a very promising approach as can be seen from the extensive work in this field. See, for instance: WO 2007/084888 A2, US PGPUB 2011/0017841 A1, U.S. Pat. No. 9,808,822 B2, and U.S. Pat. No. 8,740,040 B2. Although promising, jetting of a viscous material produces unwanted debris to some extent as well as the formation of defects in the final assembly. When compared to laser-based processes, it is also a slow process that depend on the dispenser mechanics.

SUMMARY OF THE INVENTION

The present inventors have recognized that it is desirable to jet print a solder paste material, but to do so in a manner without causing defects in a final assembly. To that end, the inventors have developed systems and methods that involves jetting of solder paste directly on the electronic component during or prior to the "pick and place" stage that mount the components on the PCB board, thereby addressing jetting failures while avoiding issues caused by screen-printing processes.

In one embodiment of the invention, a solder paste printing system is configured for printing solder directly onto an electronic component held by a "pick and place" machine across a very well-defined gap. The system may include one or more imaging arrangements for monitoring and control of the various processes.

In some embodiments of the invention, the printing system includes a coating system that creates a uniform layer of the printed material on a substrate. Where present, the coating system may include a syringe of the printed material and an air or mechanical pump that drives the material onto a donor or carrier substrate. The donor substrate is then moved towards and through a well-defined gap between rollers or knives to create a uniform layer of the printed material with a thickness that is defined by the gap. Alternatively, the coating system may include a screen-printing module where the material is coated on a screen or stencil of film with well-defined holes and, using a blade or a squeegee, the material is transferred to a substrate in a soft or hard engage. In still further embodiments of the invention, the coating system may include a dispenser or an inkjet head to print the material onto a substrate, a gravure or microgravure system, a slot-die system, or a roller coating system that coats a substrate with a highly uniform layer of the material to be printed. The coating system may be housed inside a closed cell with a controlled environment (cold or hot) to prevent evaporation of solvent from the printed material or to prevent material oxidation, thereby prolonging the pot life of the material. Also, the coating system may contain more than one material, thereby creating a possibility for printing plural materials onto the intermediate substrate in a controlled sequence and making it possible to print more than one material on the final substrate. Within the coating system, the donor substrate may be translatable, bidirectionally or otherwise, in a controlled manner, e.g., while opening a gap between coater rollers, creating the possibility for recoating the same area of the donor substrate with the printed material without contamination of the rollers and reducing or eliminating the amount of substrate consumed during the initial printing process, thereby preventing waste.

In various embodiments of the invention, the printed material may be a solder paste or other metal paste(s) used for printed electronics, a metal paste or a ceramic paste, an adhesive, a polymer material or a mix of a polymer and a monomer material.

The printing process may use a laser-based system that contains a high frequency laser to enable jetting of the material from one substrate to another substrate. Either may use a laser assisted deposition/laser dispensing system rotated by 0-90 degrees or 90-180 degrees from a main axis of a gravitational field within which it is located, enabling simpler mechanics without reducing printing quality.

In some embodiments of the invention, the printing unit includes a gap control unit configured to maintain a very well-defined gap between the donor substrate and the electronic component. For example, the very well-defined gap between the coated substrate and the electronic component may be maintained by a plane of three actuators at corners of a control unit that allows both translation and rotation as mentioned in US PGPUB 2005/109734 A1, U.S. Pat. No. 6,122,036 A, WO 2016/198291, and EP 3,219,412 A1. Such actuators may be used at corners of a control unit for both the coated substrate and the electronic component to allow both translation and rotation in two planes, where the two planes are independent or riding on each other.

In another embodiment of the invention, the very well-defined gap between the donor substrate and the electronic component is achieved by providing a fixed gap between the two.

In some embodiments of the invention, the intermediate substrate may be a continuous transparent film substrate, a transparent film substrate coated by a metal layer or by a metal and a dielectric layer, or a transparent solid substrate.

In some embodiments of the invention, a "pick and place" machine will hold the electronic component under the printing system and will transfer it to the PCB board. In addition, the printed image may be processed by an imaging system. Such an imaging system may be a microscope or a charge-coupled device (CCD) that takes a picture of printed material dots on the electronic component and measures the dots in two dimensions, with the measurement data subsequently being processed for accurate deposition on the final substrate. Alternatively, the imaging system may be a three-dimensional (3D) microscope that takes a picture of the printed material dots on the intermediate substrate and measures the dots in three dimensions, with the measurement data subsequently being transferred to the "pick and place" unit for accurate deposition on the final substrate. In still further embodiment of the invention, the imaging system is two microscopes or CCDs arranged such that one can image the printed material dots on the electronic component and measure the dots in two dimensions (e.g., length and width) while the other measures the dots in a third dimension (e.g., height), with all of the measurement data subsequently being transferred to the "pick and place" unit for accurate deposition on the final substrate. In any event, imaging systems may be included during and/or after the printing unit and may capture images from the electronic component. In one embodiment of the invention, an imaging system at the printing unit may employ a mirror to obtain images from a surface of the electronic component and/or a main laser channel of the printing unit to image both the dots' dimensions and a target area of the final substrate simultaneously.

BRIEF DESCRIPTION OF THE DRAWINGS

The present invention is illustrated by way of example, and not limitation, in the figures of the accompanying drawings, in which:

FIGS. 2a and 2b illustrate schematically aspects of a system configured in accordance with the conceptual overview presented in FIG. 1.

FIGS. 4a and 4b illustrate the creation of a uniform film by placing a material on a film substrate by a syringe (FIG. 4a) and passing the material through a well-defined gap to create a uniform layer (FIG. 4b), in accordance with some embodiments of the present invention.

FIG. 5 illustrates aspects of using a main laser channel or a mirror for imaging of dots on a solid or film substrate in accordance with some embodiments of the present invention.

DESCRIPTION OF THE INVENTION

The present invention relates to systems and methods that enable printing of solder paste at high resolution on top of an electronic component at a very high rate, for example direct printing of solder paste on top of an electronic component from a coated film, and subsequently placing the electronic component directly onto a substrate (e.g., a PCB board or other substrate). The printing process may be performed using a laser assisted deposition/laser dispensing system to achieve the high resolution at high speed. The electronic component can be any electronic component used for SMT processes, for example, a capacitor, a resistor, a diode, a chip, a full integrated circuit, or any other component. Placement of the electronic component on the substrate may be performed using a "pick and place" machine that holds the components and exposes back sides thereof for printing of the solder paste thereon and placing of the component on the PCB board with the printed solder paste between the component and the substrate.

In some instances, multiple materials may be printed to the electronic component. For example, after printing of a first material in the manner described above, the electronic component may be maintained under the printing unit until a second (or additional) material is dispensed onto it from the coated film at one or more locations. The second (or additional) material may be applied to the coated film prior or subsequent to the printing of the first material onto the electronic component. Using such an approach, plural materials can be printed onto the electronic component at approximately the same time. It is even possible to have multiple coated films within a single print area at the same time so that respective different materials coating the multiple films can be printed substantially simultaneously by scanning a laser or other print head over the coated films while maintaining the electronic component in a single print area. One example of using multiple materials with electronic components is adhesives printing. In such cases, a mixture of two materials can initiate a reaction between the materials (as is the case in the epoxy-amine or silanol-Pt catalysts). To that end, the materials are not mixed at the coated substrate but only once printed on the electronic component. By doing so, clogging of print heads and other unwanted side effects are avoided.

Figure 1:
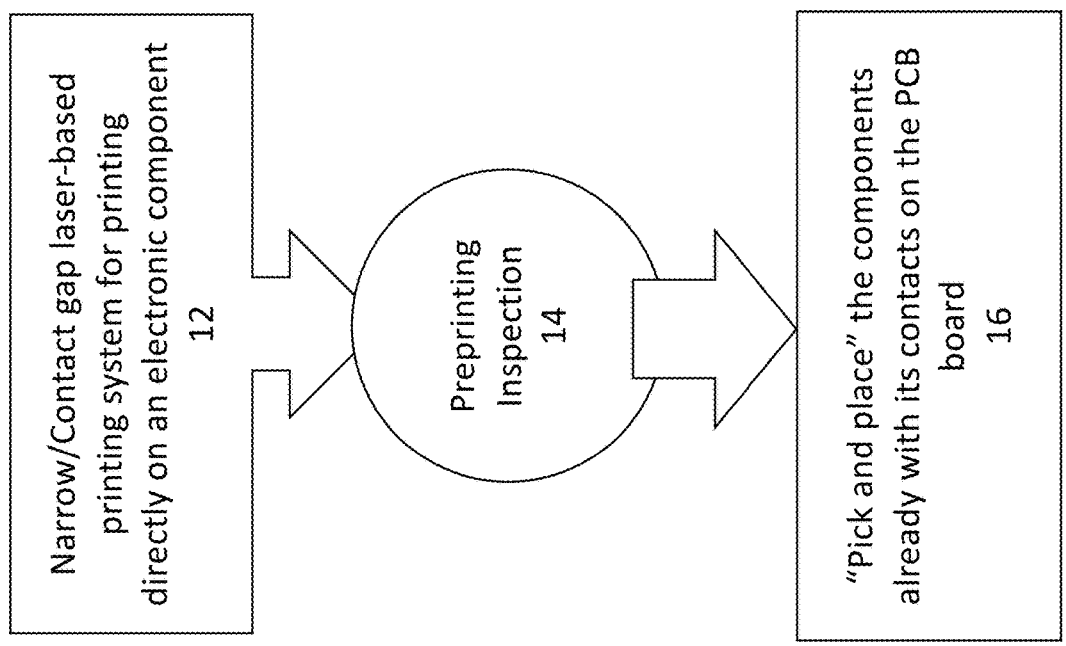
FIG. 1 illustrates, in a conceptual manner, a system configured in accordance with embodiments of the present invention which employs a narrow gap, laser-based printing system to provide high resolution and high speed printing of solder paste, and "pick and place" placement system to achieve a very high yield, accurate and robust placement of electronic components onto the PCB board.

Before describing the invention in detail, it is helpful to refer to FIG. 1, which provides a conceptual overview of a system 10 that employs a narrow or contact gap printing system 12 for printing solder paste (or other material) directly on an electronic component, preprinting processing and/or inspection 14, and pick and place positioning of the components having the solder paste printed thereon onto a PCB or other substrate 16, in accordance with embodiments of the invention. As further described below, the narrow or contact gap printing system may include an initial coating of the solder paste to a donor substrate. As part of the preprinting processing and/or inspection 14, the solder paste as printed on the components may be observed by one or more imaging arrangements for monitoring and control of the initial and subsequent processes. Then, when the components are placed on the PCB or other substrate with the previously printed solder paste arranged between the component and the PCB, the positioning procedure may also be observed by one or more imaging arrangements.

In one implementation of this procedure, the solder paste is distributed as dots (e.g., small, generally round spots or droplets) on the components during the first printing process 12, and the solder dots on the components are observed by an imaging system before the components are placed onto the PCB with the solder dots located between the component and the PCB. The printing of the solder dots onto the component may be by a laser assisted deposition/laser dispensing system printing unit, where the solder dots are ejected from a uniform layer of solder paste on a coated substrate onto the components using a fast frequency laser. The jetting of the material is conducted in a well-defined and robust way to maintain a low dot size distribution. In such an arrangement, the coated substrate has an important role in the robustness of the system. Therefore, an additional coating system can be added before the first printing unit. Such a coating system can be a traditional coating system based on a micro gravure or slot die coater or a roller coating system. It can also be a screen-printing based coating system, a dispenser, or an inkjet system.

Figure 2B:
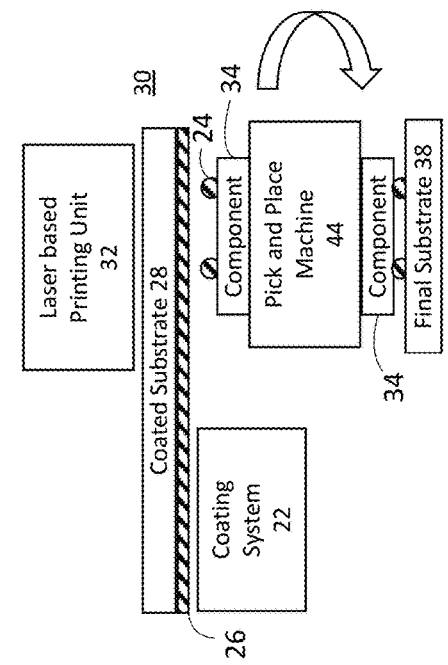

FIGS. 2a and 2b illustrate schematically aspects of systems 20a, 20b configured in accordance with the conceptual overview presented in FIG. 1. Each of these systems segregate the solder jetting process from the component placement process.

In FIG. 2b, printing system 20b includes a coating system 22 that creates a uniform layer 26 of the to-be printed material (e.g., solder paste) on a donor substrate 28. In one embodiment of the invention, the coating system 22 includes a syringe of the to-be printed material and an air or mechanical pump that drives the material onto the donor substrate 28. The donor substrate 28 is then moved, using motors, rollers, etc., toward a well-defined gap between rollers or knives to create a uniform layer 26 of the to-be printed material with a thickness that is defined by the gap. In some embodiments of the invention, the donor substrate 28 can translate bidirectionally in a controlled manner while opening the gap between the coater rollers, creating the possibility for recoating the same area of the donor substrate with the to-be printed material without contamination to the rollers and reducing or eliminating the amount of substrate consumed during the initial printing process, thereby preventing waste.

In further embodiments, coating system 22 may include a screen-printing module where the donor substrate 28 is coated using a screen or stencil with well-defined holes, the viscous material being applied thereto using a blade or a squeegee, with the viscous material being later transferred to the donor substrate 28 in a soft or hard engage. Alternatively, coating system 22 may include a dispenser or an inkjet head to print the viscous material onto donor substrate 28. Or, the coating system 22 may be a gravure or micro-gravure system that coats donor substrate 28 with a highly uniform layer 26 of the material to be printed. In one embodiment of the invention, coating system 22 is a slot-die system that coats donor substrate 28 with a highly uniform layer 26 of the material to be printed. In another embodiment of the invention, coating system 22 is a roller coating system that coats donor substrate 28 with a highly uniform layer 26 of the material to be printed. Although not shown in detail, the printing system 20a of FIG. 2a may also include a coating system (such as coating system 22) as part of a laser-based printing system 30.

As shown in FIG. 2a, in one embodiment of the invention a laser-based printing system 30, which may include a laser-based printing unit 32 and, optionally, a coating system 22, is housed inside a closed cell 35 with a controlled environment (cold or hot) to prevent evaporation of solvent from the to-be printed material or to prevent material oxidation, thereby prolonging the pot life of the material. In some embodiments of the invention, the coating system 22 contains more than one material, thereby creating a possibility for printing plural materials onto the electrical components in a controlled sequence and making it possible to print more than one material on a final substrate 38.

Returning to FIG. 2b, the laser-based printing unit 32 prints dots 24 of the solder paste from the coated substrate 28 directly on electrical contacts of the electrical components 34. The laser-based printing unit 32 used in this narrow gap/contact printing process 30 may include a laser-based system that contains a high frequency laser configured to jet portions of the layer of coated material 26 from the donor substrate 28 to electrical components 34 by a laser assisted deposition/laser dispensing system. The laser assisted deposition/laser dispensing system may be rotated by 0-90 degrees or 90-180 degrees from a main axis of a gravitational field within which it is located, enabling simpler mechanics without reducing printing quality.

Alternatively, where no coating system is used, the narrow gap/contact printing process 30 may employ an inkjet head system that enables jetting the solder paste directly to the electrical components 34. Or, the narrow gap/contact printing process 30 may use a dispenser head system that enables printing the material directly to the electrical components 34. Still further, the narrow gap/contact printing process 30 may use an offset printer module, a gravure printing module, or any conventional printing technique to print the material directly to the electrical components 34. For example, the narrow gap/contact printing process 30 may use a screen-printing module where the to-be printed material is coated on a screen or stencil of film with well-defined holes and a blade or a squeegee is employed to transfer the material to the electrical components 34 in a soft or hard engage, creating an array of dots of to-be printed material on the electrical components 34.

In some embodiments of the invention, the first printing unit 32 employed in the narrow gap printing process 30 includes a very well-defined gap control unit between the donor substrate 28 and the electrical components 34. In one instance, the very well-defined gap between the donor substrate 28 and the electrical components 34 is maintained using a set of three actuators at corners of a control unit that allows both translation and rotation, as described in US PGPUB 2005/109734 A1, U.S. Pat. No. 6,122,036 A, WO 2016/198291, and EP 3,219,412 A1, incorporated herein by reference. Sets of three actuator units may be used at corners of a control unit for both the donor substrate and the electrical components 34 to allow both translation and rotation in both planes, wherein the two planes are independent or riding on each other. Alternatively, the very well-defined gap between the donor substrate 28 and the electrical components 34 may be maintained by providing a fixed support below the donor substrate and/or the electrical components 34.

In some embodiments of the invention, after printing to the electrical components 34 in the first printing unit 32, the printed electrical components 34 may be returned to the first printing unit 32 for a second printing of viscous material. In any event, after being printed with the viscous material (in the form of dots 24 or other arrangements) the electrical components 34 are moved from the first printing unit 32 toward a substrate 38, e.g., a PCB, where they are placed with the printed solder paste and/or other viscous material between a respective electrical component 34 and the substrate 38.

In some embodiments of the invention, during movement of the electrical components 34 from the first printing unit 32 to the substrate 38 on which the components are placed, the material (e.g., solder paste) printed on the electrical components 34 may be processed by an imaging system 50 (see, e.g., FIG. 2a). Such an imaging system 50 may be one or more microscopes, charge-coupled devices (CCD), and/or other imaging components that takes a picture (or pictures) of the printed dots of material 24 on the electrical components 34 and measures the dots in two dimensions or in three dimensions. For example, the imaging system 50 may include two microscopes or CCDs arranged such that one can image the printed dots on the intermediate substrate and measures the dots in two dimensions (e.g., length and width) while the other measures the dots in a third dimension (e.g., height). This measurement data may be subsequently transferred to the pick and place machine 44 in order to ensure accurate deposition of the electrical components 34 on the substrate 38. For example, and as shown in FIG. 2a, the optical or other imaging inspection may reveal that while many of the dots 24 are suitable for transfer of the electrical components 34 to the substrate 38 (e.g., illustrated with a check mark in the figure), some of the dots 24 are misshapen or otherwise unsuitable for transfer to the final substrate 38 (e.g., illustrated with an "X" in the figure). A controller (not illustrated) having access to this data may then operate the pick and place machine 44 so as to omit transferring the unsuitable ones of the electrical components 34 to the substrate 38. Imaging systems may also be included after the placement of the electrical components 34 to ensure placement of those components was made properly. In one embodiment of the invention, an imaging system is positioned at the printing unit 32 and a mirror or other optical element employed to obtain images from the surface of the electrical components 34 and/or a laser channel 52 of the printing unit may be used to image both the dots' dimensions and the electrical components.

Figure 3:
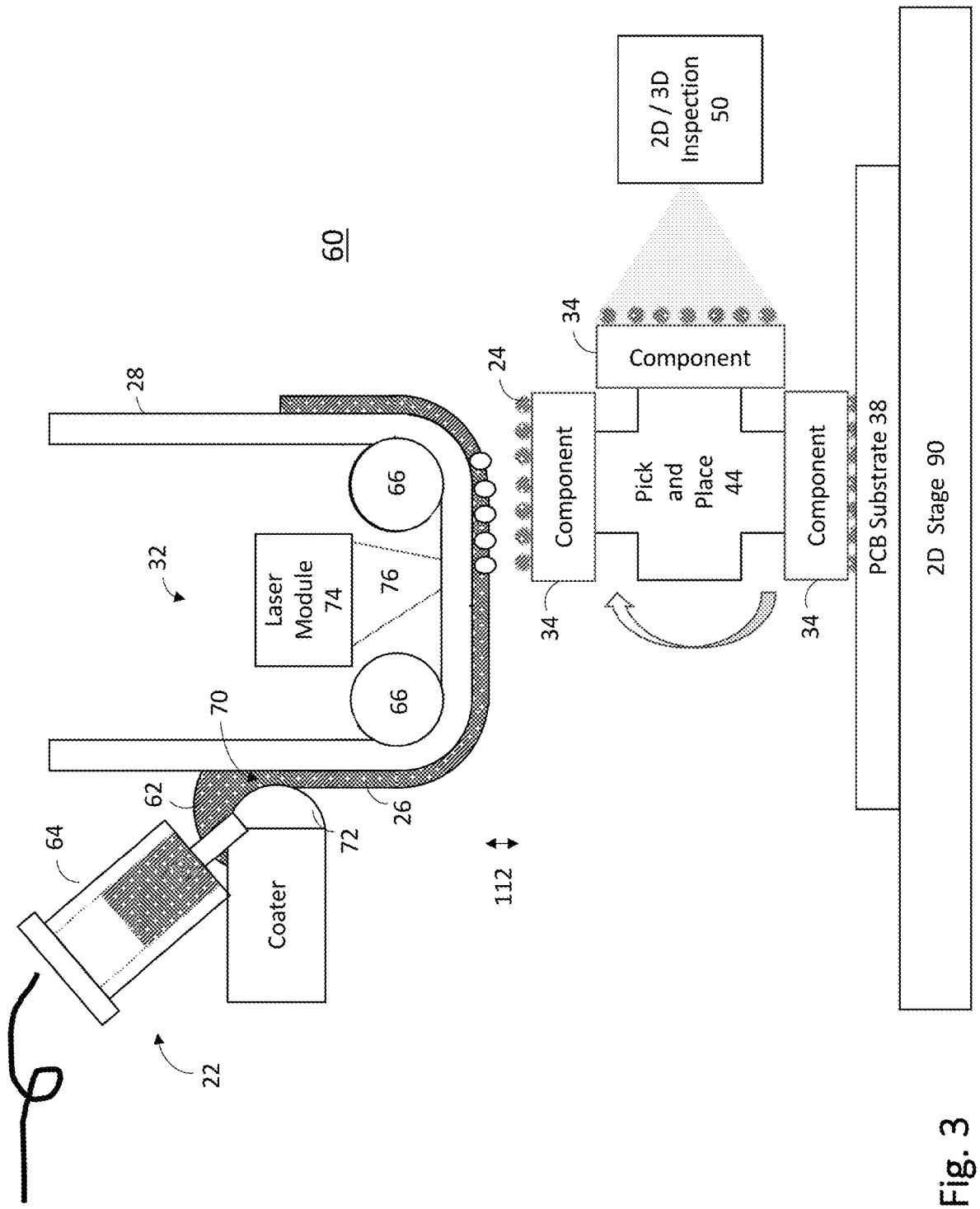
FIG. 3 illustrates an example of a system arrangement configured in accordance with the schematic illustration shown in FIG. 2, using a coated substrate, a laser-based printing system, a "pick and place" machine that holds the electronic component, and an optional imaging system before placement of the electronic component.

FIG. 3 illustrates one example of a system 60 configured in accordance with the present invention. System 60 instantiates aspects of systems 20a and 20b, described above. In particular, system 60 includes a coating system 22 that creates a uniform layer 26 of solder paste (and/or other material) 62 on a donor substrate 28 using an air or mechanical pump (not shown) to drive the solder paste 62 from a reservoir, e.g., a syringe 64, onto the donor substrate 28. The donor substrate 28 is then moved, using rollers or gears 66, toward a well-defined gap 70 between rollers or knives 72 to create a uniform layer 26 of the solder paste on the donor substrate 28 with a thickness that is defined by gap 70.

System 60 also includes a laser-based printing unit 32 configured to produce dots 24 of the solder paste 62 on the electrical components 34. In this example, the donor substrate 28 may be a transparent film and the laser-based printing unit 32 includes a laser module 74 that contains a high frequency laser arranged to jet portions of the layer of coated material 26 from the donor substrate 28 to form dots 24 on electrical components 34 by focusing a laser beam 76 onto the interface between the layer of material 26. The incident laser beam causes local heating followed by a phase change and high local pressure which drives jetting of the solder paste 62 onto the electrical components 34. After printing to an electrical component 34, the printed electrical component can be returned for a second (or additional) layer printing of solder paste 62 if necessary or desired.

Alternatively, the donor substrate 28 may be a screen or grid in which the solder paste 62 is introduced into holes of the screen by coater 72, which may be a roller or blade. In such cases, the incident laser beam 76 from laser module 74 causes the solder paste to be displaced from the holes in the screen onto the electrical components 34.

Once the dots 24 are printed on the electrical components 34, the components 34 are moved, e.g., by pick and place machine 44, toward an inspection area of an imaging system 50 that includes one or more 3D and/or 2D imaging components configured to take pictures of the printed dots 24 of solder paste and measure the dots in two dimensions or three dimensions. This measurement data may be used by the pick and place machine 44 in order to ensure accurate deposition of the components 34 on the final substrate 38 and/or to return a component to the solder paste print area for application of new or additional solder paste dots 24.

After inspection by imaging system 50, if the existing solder dots 24 are deemed acceptable the component 34 is moved by the pick and place machine 44 so as to be positioned over an area of PCB substrate 38 where it is to be placed. The PCB substrate 38 may be positioned correctly using a two-dimensional stage 90, so as to be properly oriented to receive the component 34. The component 34 is then placed on the PCB substrate 38 with the solder dots 24 therebetween so as to affix the component in place on the PCB substrate.

Although not illustrated in the diagram, an additional inspection unit (similar to inspection unit 50) may be associated with the area in which a component 34 is placed on the PCB substrate 38. Such an inspection unit may include a mirror or other optical element employed to obtain images from the surface of the PCB substrate to assist in alignment of the PCB substrate below the electronic component 34 via stage 90, as well as to help synchronize the placement of the electrical component on the PCB substrate.

An alternative arrangement of the laser-based printing unit 32 may include a coating system 22 in which the solder paste 62 is driven from a reservoir, e.g., a syringe 64, using an air or mechanical pump onto a roller. The material layer on the roller may be kept uniform in thickness using one or more knives displaced a defined distance above the surface of roller. The roller may be dimpled or otherwise formed with recesses to contain defined amounts of the material to be printed, which amounts are transferred to a printing roller as the two rollers contact one another in a material transfer area. Alternatively, the roller may have a screen or grid-like surface with holes into which the solder paste is introduced. As the roller completes its rotation through a printing area, it transfers the solder paste in the form of dots onto the electrical components. After the material is transferred from roller, that roller may pass through an inspection area and any remaining solder paste may be removed using knives or other instruments prior to application of new solder paste.

When transferring the solder paste from a donor substrate 28 to an electronic component 34, for example using one of the techniques described above, a very well-defined gap 112 may be maintained between the coated donor substrate 28 and the electronic component 34 by positioning of the rollers 66 and/or the electronic component 34 to receive the solder paste. The width of the gap may be monitored by one or more inspection units (not shown) and maintained by an appropriate control system (not shown). Also, although FIG. 3 shows a system oriented in a vertical fashion with respect to deposition of the solder paste dots 24 onto the electronic components 34 and the electronic components 34 onto the substrate 38, either or both of these operations may be performed at 90 degrees (or any other orientation) to the gravitational field within which the system 60 is located. By way of example, in the illustration if the gravitational field is assumed to be from the top of the page to the bottom of the page, the laser-based printing unit may be configured to print solder paste dots 24 from the donor substrate 28 to the electronic components 34 at an angle orthogonal to that gravitational field. Such an arrangement may provide a more compact configuration than is shown in the illustration.

FIGS. 4a and 4b further illustrate the creation of a uniform layer 26 of solder paste on a donor substrate 28 by placing an amount of material 62 on a film substrate 28 using a syringe 64 (FIG. 4a) and passing the material through a well-defined gap 126 to create a uniform layer 26 of solder paste (FIG. 4b), in accordance with some embodiments of the present invention. The well-defined gap 126 is created by bringing a pair of rollers 128a, 128b or knives close together using an appropriate control unit (e.g., a stepper motor or piezo transducer).

FIG. 5 illustrates aspects of using a main laser channel for imaging of solder paste dots 24 on electronic component 34 in accordance with some embodiments of the present invention. In this example, dots 24 of solder paste have been printed on an electronic component 34 and a camera 196 is used to image the dots via the main laser channel. Alternatively, the camera 196 may be offset from the main laser channel and a semitransparent mirror 198 inserted therein so as to reflect images of the dots 24 towards the camera. Imaging of this kind may be used to ensure optimal placements of the material dots onto the electronic components. A similar imaging system using a camera and a mirror can be used to monitor the placement of the electronic component on the PCB substrate from top and/or from the side, although no laser is present at that transfer point.

Thus, systems and methods for printing solder paste on electronic components from a coated film and placing the electronic components onto a substrate with the solder paste therebetween have been described. In various embodiments, these systems and methods employ a multistep procedure in which the solder paste is dispensed onto a donor substrate and is then printed onto an electronic component before the electronic component is finally affixed to a substrate. The solder paste and/or electronic components can go through one or more steps of imaging as they proceed through the various steps in the overall process. In order to achieve a very narrow dot size distribution in the printing to the electronic components, it is important to have very well-defined distance control between the coated donor substrate and the electronic components. For that purpose, any of several mechanical solutions can be used. For example, the distance between the coated donor substrate (which may be a film or foil) and the electronic components may be controlled by using mechanical, well-defined foil or two rollers adjacent to each other. Or, the distance between the coated donor substrate and the electronic components may be defined deterministically by having both on the same machine.

To enhance the jetting placement and resolution during printing, an imaging system can be added to monitor the dimensions and placement of the printed dots on the electronic component and on the final substrate. To that end, one or more imaging systems can be added both for monitoring the electronic components and for monitoring the final substrate. Such imaging systems can use a CCD, a microscope, or a 3D microscope and computer software to monitor the dot size on the electronic components and/or the height of the dots at an angle perpendicular to the plane of the electronic components. The monitoring can be done before and/or after the placement of the components onto the final substrate.

Although not illustrated in detail, it should be appreciated that the various components of the systems described herein operate under the control of one or more controllers, which, preferably, are processor-based controllers that operate under the instruction of machine-executable instructions stored on tangible machine-readable media. Such controllers may include a microprocessor and memory communicatively coupled to one another by a bus or other communication mechanism for communicating information. The memory may include a program store memory, such as a read only memory (ROM) or other static storage device, as well as a dynamic memory, such as a random-access memory (RAM) or other dynamic storage device, and each may be coupled to the bus for providing and storing information and instructions to be executed by the microprocessor. The dynamic memory also may be used for storing temporary variables or other intermediate information during execution of instructions by the microprocessor. Alternatively, or in addition, a storage device, such as a solid state memory, magnetic disk, or optical disk may be provided and coupled to the bus for storing information and instructions. The controller may also include a display, for displaying information to a user, as well as various input devices, including an alphanumeric keyboard and a cursor control device such as a mouse and/or trackpad, as part of a user interface for the printing system. Further, one or more communication interfaces may be included to provide two-way data communication to and from the printing system. For example, network interfaces that include wired and/or wireless modems may be used to provide such communications.

In various embodiments then, the invention provides:

Systems and methods that enable printing solder paste or other viscous materials, e.g., high viscos polymers, acrylics, epoxy, adhesives (e.g., urethane-based adhesives), pastes, or waxes, at high resolution and high speed directly on an electronic component using a laser-based printing unit and using a "pick and place" technique to place the component on a PCB board or other substrate.

A system or method including a printing unit, optionally including a coating unit, that prints a viscous material, such as a solder paste or any of the materials identified above, on an electronic component, which component is then placed on a final substrate.

A system or method as in any of the foregoing embodiments, where the printing unit is highly accurate, low to non-debris producing, and very fast.

A system or method as in any of the foregoing embodiments, where the printing unit includes a coating system that creates a uniform layer of the viscous material on a substrate, and the coating system includes a syringe of the viscous material and an air or mechanical pump that drives the viscous material onto a carrier substrate, which is then moved, e.g., using motors or rollers, etc., toward a well-defined gap between rollers or knifes to create a uniform layer of the viscous material on the carrier substrate, with a thickness that is defined by the gap.

A system or method as in any of the foregoing embodiments, where the coating system includes a screen-printing module, a dispenser or an inkjet head, a gravure or microgravure system, a slot-die system, or a roller coating system, inside a closed cell with a controlled environment to prolong the pot life of the viscous material.

A system or method as in any of the foregoing embodiments, where the coating system contains more than one material, thereby creating a possibility for printing plural materials onto the electronic component in a controlled sequence.

A system or method as in any of the foregoing embodiments, where the carrier substrate can be translated bidirectionally in a controlled manner, while opening the gap between the coater rollers, creating the possibility for recoating the same area of the carrier substrate with the viscous material multiple times without contamination to the rollers to reduce waste.

A system or method as in any of the foregoing embodiments, where the viscous material is a solder paste, a metal paste, an adhesive used for printed electronics, or other viscous material.

A system or method as in any of the foregoing embodiments, where the printing unit is a laser-based system that contains a high frequency laser to enable jetting of the viscous material from the coated substrate to the electronic component, and the printing unit is a laser assisted deposition/laser dispensing system rotated by 0-90 degrees, or 90-180 degrees from a main axis of a gravitational field in which it is located.

A system or method as in any of the foregoing embodiments, where the printing unit includes a very well-defined gap control unit between the coated substrate and the electronic component, where gap control is achieved by a plane of three actuators at corners of the gap control unit that allows both translation and rotation or by creating a plane of three actuators at corners of the gap control unit for both the coated substrate and the electronic component to allow both translation and rotation in both planes and where the two planes are independent or riding on each other, or by creating a fixed mechanical gap.

A system or method as in any of the foregoing embodiments, where a continuous transparent film substrate is used as a coated substrate for the system, and the transparent film substrate is coated by a metal layer or by a metal and a dielectric layer.

A system or method as in any of the foregoing embodiments, where the placement of the electronic component done by a "pick and place machine," with or without an imaging system.

A system or method as any of the foregoing embodiments, where any of the imaging systems is a microscope or a CCD that takes a picture of the solder paste on the electronic component and measures the dots in two dimensions, or is a 3D microscope that takes a picture of the printed solder paste on the electronic component and measures the dots in three dimensions, or is two microscopes or CCDs arranged so that one can take picture of the printed solder paste on the electronic component and measures the dots in two dimensions while the other is measuring the solder paste in a third dimension orthogonal to the other two dimensions, or where the imaging system is at the printing unit itself and employs a mirror to image the surface of the electronic component or uses the main laser channel to image both printed solder area dimensions and the electronic component simultaneously.

What is claimed is:

1. A system, comprising:
   a laser-based printing system including a coating system configured to create a uniform layer of a viscous material on a donor substrate, and a laser-based printing unit configured to print individual dot-like portions of the viscous material from the donor substrate onto an electronic component; and
   a pick and place unit configured to place the electronic component having the dot-like portions of the viscous material printed thereon onto a substrate so that the dot-like portions of the viscous material are disposed between the electronic component and the substrate,
   wherein the laser-based printing unit is configured to print the individual dot-like portions of the viscous material from the donor substrate onto the electronic component while the electronic component is held by the pick and place unit across a first gap between the donor substrate and the electronic component, and
   wherein the coating system includes a syringe of the viscous material arranged to drive the viscous material onto the donor substrate, and the coating system is further configured to transport the donor substrate with the viscous material thereon towards and through a second gap between rollers or knifes to create the uniform layer of the viscous material on the donor substrate, the uniform layer of the viscous material having a thickness that is defined by the second gap.

2. The system of claim 1, wherein the coating system further includes a screen-printing module configured to coat a screen or stencil of film having holes with the viscous material, and the coating system is further configured to transfer the viscous material to the electronic component from the screen or stencil of film using a blade or a squeegee.

3. The system of claim 1, wherein the coating system further comprises one of: a dispenser or an inkjet head configured to print the viscous material onto the donor substrate, a gravure or micro-gravure system configured to coat the donor substrate with the uniform layer of the viscous material, a slot-die system configured to coat the donor substrate with the uniform layer of the viscous material, or a roller coating system configured to coat the donor substrate with the uniform layer of the viscous material.

4. The system of claim 1, wherein the coating system is enclosed in a controlled environment.

5. The system of claim 1, wherein the coating system is configured to apply more than one material onto the donor substrate in a plurality of printing procedures.

6. The system of claim 1, where the viscous material is one of a solder paste, a metal paste, a ceramic paste, a wax material, a polymer material, an acrylic, an epoxy, or an adhesive.

7. The system of claim 1, wherein the laser-based printing unit comprises a high frequency laser configured to jet the dot-like portions of the viscous material from the donor substrate to the electronic component.

8. The system of claim 1, wherein the laser-based printing unit is a laser assisted deposition/laser dispensing system rotated by 0-90 degrees or 90-180 degrees from a main axis of a gravitational field within which it is located.

9. The system of claim 1, wherein the laser-based printing unit comprises one of:
   an inkjet head system configured to jet the dot-like portions of the viscous material directly to the electronic component;
   a dispenser head system configured to print the dot-like portions of the viscous material directly to the electronic component;
   an offset printer module;
   a gravure printing module; or
   another printing module configured print to the dot-like portions of the viscous material directly to the electronic component.

10. The system of claim 1, wherein the laser-based printing unit is configured to maintain the first gap between the donor substrate and the electronic component.

11. The system of claim 1, further comprising one or more imaging systems arranged to (i) image the dot-like portions of the viscous material printed on the electronic component during movement of the electronic component from the laser-based printing unit to the substrate, (ii) the electronic component after the electronic component has been placed on the substrate, or (iii) both.

12. The system of claim 11, wherein at least one of the one or more imaging systems is configured to measure, in two or three dimensions, the dot-like portions of the viscous material printed on the electronic component during movement of the electronic component from the laser-based printing unit to the substrate.

13. A method, comprising:
   creating a uniform layer of a viscous material on a donor substrate using a coating system of a laser-based printing system, wherein the coating system includes a syringe of the viscous material and wherein creating the uniform layer of the viscous material comprises:
      driving the viscous material from the syringe onto the donor substrate; and
      transporting by the coating system the donor substrate with the viscous material thereon towards and through a second gap between rollers or knifes to create the uniform layer of the viscous material on the donor substrate, the uniform layer of the viscous material having a thickness that is defined by the second gap between the rollers or the knifes;
   printing individual dot-like portions of the viscous material from the donor substrate onto an electronic component by a laser-based printing unit of the laser-based printing system while the electronic component is held by a pick and place unit across a first gap between the donor substrate and the electronic component; and
   transferring the electronic component with the dot-like portions of the viscous material printed thereon to a substrate by the pick and place unit.

14. The method of claim 13, wherein the coating system further includes a screen-printing module that coats a screen or stencil of film having holes with the viscous material, and the coating system transfers the viscous material to the electronic component from the screen or stencil of film using a blade or a squeegee.

15. The method of claim 13, wherein the coating system applies more than one material onto the donor substrate in a plurality of printing procedures.

16. The method of claim 13, wherein the laser-based printing unit uses a laser to jet the dot-like portions of material from the donor substrate to the electronic component.

17. The method of claim 13, further comprising imaging, using one or more imaging systems, (i) the dot-like portions of viscous material printed on the electronic component, (ii) the substrate after the electronic component with the dot-like portions of the viscous material printed thereon has been placed on the substrate, or (iii) both.

* * * * *